United States Patent [19]

Mermet-Guyennet

[11] Patent Number: 5,243,496
[45] Date of Patent: Sep. 7, 1993

[54] MOLDED CASE INTEGRATED CIRCUIT WITH A DYNAMIC IMPEDANCE REDUCING DEVICE

[75] Inventor: Michel Mermet-Guyennet, Saint Egreve, France

[73] Assignee: SGS-Thomson Microelectronics S.A., Gentilly, France

[21] Appl. No.: 781,803

[22] Filed: Oct. 28, 1991

[30] Foreign Application Priority Data

Oct. 29, 1990 [FR] France ............... 90 13741

[51] Int. Cl.⁵ .................................. H05K 7/02
[52] U.S. Cl. ........................ 361/748; 174/261; 257/690; 361/783; 361/764; 361/813
[58] Field of Search ........... 361/421, 400, 401, 404, 361/406, 408, 413, 397, 421; 357/70; 174/255, 261; 257/688, 692, 690, 784

[56] References Cited

U.S. PATENT DOCUMENTS

| | | | |
|---|---|---|---|
| 4,714,952 | 12/1987 | Takekawa et al. | 357/75 |
| 4,903,113 | 2/1990 | Frankeny et al. | 357/70 |
| 4,933,744 | 6/1990 | Segawa et al. | 357/72 |
| 4,993,148 | 2/1991 | Adachi et al. | 29/832 |
| 5,079,673 | 1/1992 | Kodai et al. | 361/400 |
| 5,107,325 | 4/1992 | Nakayoshi | 357/69 |
| 5,151,771 | 9/1992 | Hirai et al. | 357/70 |
| 5,166,866 | 11/1992 | Kim et al. | 361/403 |
| 5,175,397 | 12/1992 | Lindberg | 174/52.4 |

FOREIGN PATENT DOCUMENTS 63-092047 4/1988 Japan.
63-122159 5/1988 Japan.

*Primary Examiner*—Leo P. Picard
*Assistant Examiner*—Young S. Whang
*Attorney, Agent, or Firm*—Lowe, Price, LeBlanc & Becker

[57] ABSTRACT

A device for reducing dynamic impedances in a molded case integrated circuit comprises a chip (15) and several annular metal planes (21, 22) separated from each other by an insulating film (27, 28), each plane comprising, on its external border, legs (23, 24) coupled to the exterior of the case and, on its internal border, legs (25, 26) coupled to pads of the chip (15). The legs (23-26) are connected to the exterior and to the pads of the chip through leads (20) of a conventional connection network.

18 Claims, 2 Drawing Sheets

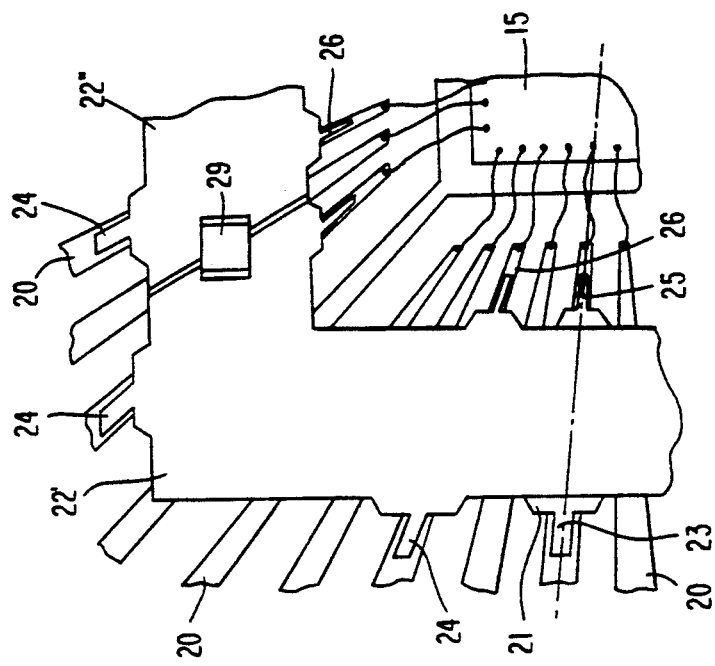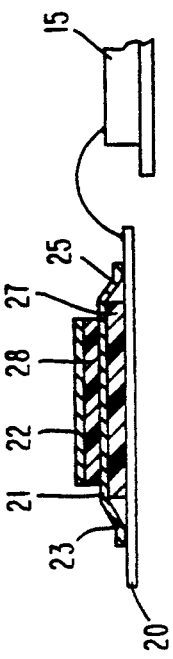
Fig. 2A
Fig. 2B
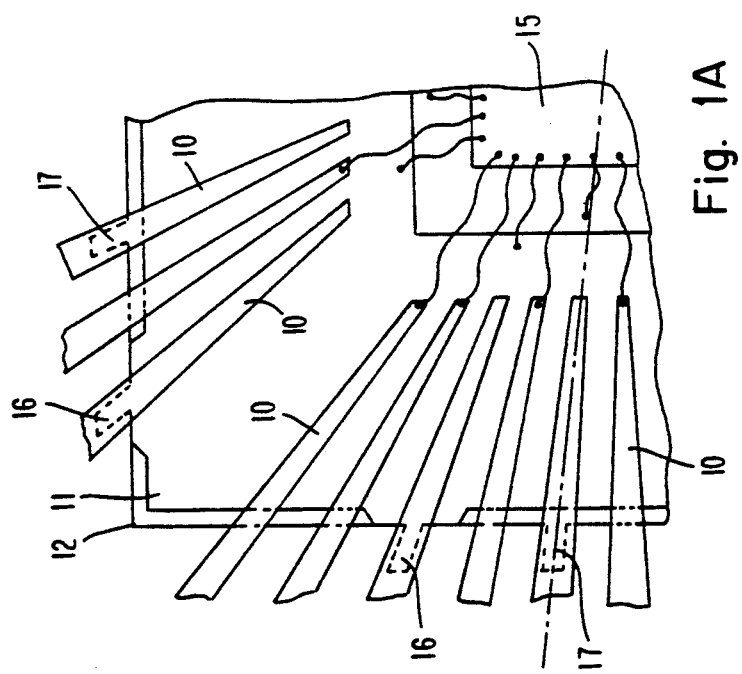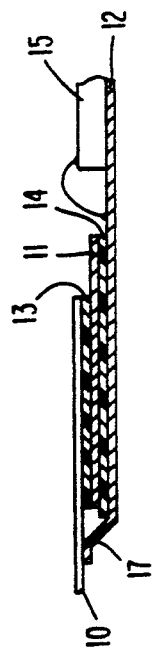
Fig. 1A
(PRIOR ART)
Fig. 1B
(PRIOR ART)

MOLDED CASE INTEGRATED CIRCUIT WITH A DYNAMIC IMPEDANCE REDUCING DEVICE

BACKGROUND OF THE INVENTION

The present invention relates to the field of molded case integrated circuits and especially to integrated circuits with a molded case comprising a device for reducing the dynamic impedance of power lines.

When operating, some integrated circuits require high current peaks. It is then necessary that the supply lines have low dynamic impedances, that is, that these lines each have a low resistance and a low inductance and are provided with a decoupling capacity coupled to another supply line.

According to conventional bonding techniques, a method for decreasing resistances and inductances of connections is to increase the number of connections affected to supply voltages. Thus, the parasitic resistances and inductances are paralleled and their values are practically divided by the number of connections in parallel. But, if it is desired to sufficiently decrease the parasitic resistances and inductances, the number of connections affected to the power supplies must be substantially increased, which is incompatible with integrated circuits requiring a large number of inputs/outputs.

In the description that follows, the plane of the connection leads will be referred to as connection network.

FIGS. 1A and 1B are top and cross-section views, respectively, of a multilayer lead frame of the prior art adapted to the lead frame and wire bonding technique. This lead frame comprises several layers constituted by a layer of leads or connection network 10, a first metal plane 11 and a second metal plane 12, separated and bonded by insulating films 13 and 14. Plane 12 supports a chip 15. Plane 11 is annular to leave space around chip 15 for connecting it to plane 12. Legs 16 on the periphery of plane 11 are soldered on leads connected to a first supply terminal. Similarly, legs 17 on the periphery of plane 12 are soldered to other leads connected to a second supply terminal. The supply pads of chip 15 normally intended to be connected to the supply leads, are bonded by wires to the corresponding planes and the remaining pads are bonded by wires to the proximal ends of the remaining leads.

Thus, the supply connections pass through planes instead of passing through long thin leads. This substantially decreases parasitic resistances and inductances. Moreover, planes 11 and 12 form a decoupling capacity between the supply lines.

However, compared to a realization comprising only one layer corresponding to the connection network 10, with this arrangement, it is necessary to shorten the ends of the leads in order to be able to bond the chip supply pads to the planes. This involves the use of longer wires between the other chip pads and the ends of the leads. In practice, three layers is a maximum because, otherwise, the bonding wires between the chip and the ends of the leads would be too long to ensure a satisfactory reliability and, especially, this would introduce additional resistances and inductances, which is precisely what is desired to avoid.

A further drawback of this arrangement is that wires are particularly difficult to solder on the proximal ends of the leads because the insulating film 13 which supports them softens under the soldering heat.

Moreover, these multilayer lead frames are expensive since it is necessary to stamp the metal planes 11 and 12 with a specific equipment and their implementation is delicate and requires an adaptation of the conventional processes for handling and soldering the conventional frames, since the bonding wires are of different lengths.

SUMMARY OF THE INVENTION

An object of the invention is to provide a device for reducing the dynamic impedance of the supply lines, simple and inexpensive to implement, and liable to be used with conventional lead frame without modifying their mode of connection to the chip.

A further object of the invention is to provide the above device in integrated circuits obtained according to the Tape Automated Bonding (TAB) technique.

These objects as well as others of the invention are obtained with a device for reducing dynamic impedances in a molded case integrated circuit comprising a chip and a plurality of annular metal planes separated from each other by an insulating film, each of these planes comprising, on its external border, legs coupled to the exterior of the case and, on its inner border, legs coupled to the pads of the chip.

According to an embodiment of the invention, the legs are coupled to the exterior and to the chip pads through leads of a conventional connection network.

According to an embodiment of the invention, the legs are soldered on the leads.

According to an embodiment of the invention, the annular planes and their legs are obtained by etching a metal film fixed on a plastic tape which constitutes the insulating film.

According to an embodiment of the invention, the connection network is also obtained by etching.

According to an embodiment of the invention, the leads of the network are connected to shortened leads of a conventional lead frame.

According to an embodiment of the invention, the annular plane of the last layer is comprised of several portions.

According to an embodiment of the invention, the annular plane of the last layer comprises a capacitor connected between adjacent portions.

BRIEF DESCRIPTION OF THE DRAWINGS

The foregoing and other objects, features and advantages of the invention will be apparent from the following detailed description of preferred embodiments as illustrated in the accompanying figures wherein:

FIGS. 1A and 1B, previously described, show the state of the art;

FIGS. 2A and 2B are top and cross-section views, respectively, of an embodiment of the invention;

In these figures, which are not drawn to scale, same references designate same elements.

DETAILED DESCRIPTION OF THE INVENTION

Figure 3:
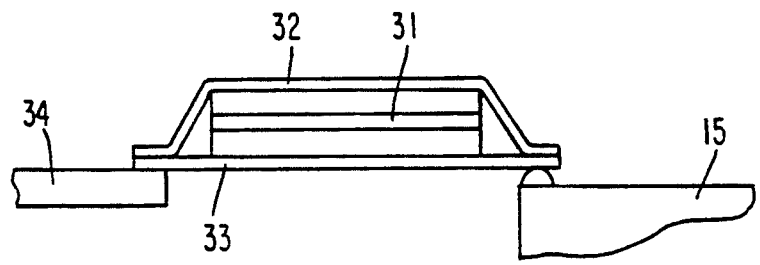
FIG. 3 is a cross-section of another embodiment of the invention.

FIGS. 2A and 2B show a conventional connection network 20 inside an integrated circuit molded case. According to the invention, two metal annular planes 21 and 22 are arranged on the leads of network 20. The external borders of the annular planes are within the case and the internal borders leave the proximal ends of the leads apparent.

Each annular plane is connected to a number of leads of network 20, for example, affected to a supply voltage, by legs 23 and 24 of the external border of each plane and by legs 25 and 26 of their internal borders. Thus, the leads are bridged by a plane, which amounts to connecting the leads and the plane in parallel and which further decreases the parasitic resistances and inductances with respect to the prior art devices.

The annular planes 21 and 22 are obtained by etching a metal film fixed on a plastic tape, as it is done according to the TAB technique. This technique enables an easy obtention of complex ring-shaped metal planes. Moreover, the plastic tape directly constitutes an insulating film, 27 and 28, between two annular plane layers.

This technique enables, according to an embodiment of divide the invention and as shown in FIG. 2A, to fraction the upper annular plane into several portions. Two portions 22' and 22" are represented, respectively connected to leads having different voltages. This allows, within the limits of the subsequently molded case, to weld surface mounted (SMC) capacitors 29 between the two portions 22' and 22" of the plane. It is thus possible to substantially increase the decoupling capacitance. The connection network 20 shown in the present case is the same as in a conventional lead frame. The ends of the leads are connected to a chip 15 by wires of equal lengths.

According to another embodiment of the invention, shown in part of FIG. 3, annular planes 31 and 32, the shape of which is similar to that of planes 21 and 22 of FIGS. 2A and 2B, are arranged in the same way as above but on a connection network 33 achieved and connected to a chip 15 according to the TAB technique.

It will be noted that it is not necessary to modify the conventional connection networks to implement the invention and it is possible to provide, within the limits of the subsequently molded case, as many layers of metal planes as desired.

FIG. 3 further shows another embodiment of the invention. The distal ends of the leads of network 33 are soldered to the proximal ends of shortened leads 34 of a conventional lead frame.

Figure 4:
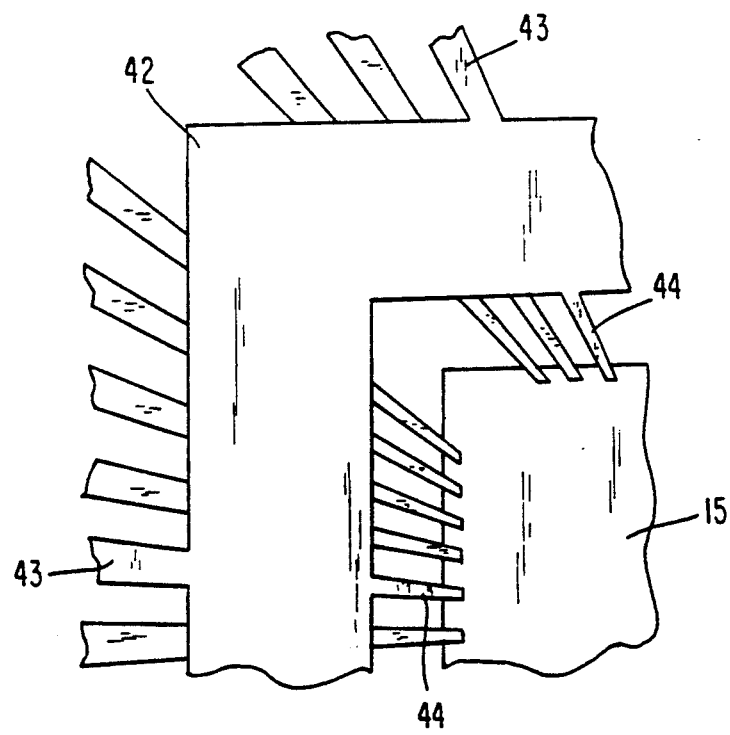
FIG. 4 is a top view of a further embodiment of the invention.

FIG. 4 shows a further embodiment of the invention. In a connection network achieved according to the TAB technique, the leads provided to be connected to an annular plane 42 are suppressed and it is the legs 43 of the external border of the plane and the legs 44 of the internal border, which, provided at the dimensions of the suppressed leads, replace the latter.

To describe the invention simply, only one or two annular plane layers have been represented in the figures. It is obvious, for those skilled in the art using the techniques of the invention, to provide as many additional layers as necessary, within the limits of the subsequently obtained case, to further improve the characteristics.

I claim:

1. A device for reducing dynamic impedances in a molded case integrated circuit comprising a chip and a plurality of annular metal planes separated from each other by an insulating film, each of said metal planes comprising, on its external border, legs coupled to the exterior of the molded case and, on its internal border, legs coupled to pads of said chip.

2. The device for reducing dynamic impedances according to claim 1, wherein the legs are coupled to the exterior and to the chip pads through leads of a connection network.

3. The device for reducing dynamic impedances according to claim 2, wherein said legs are soldered on the leads.

4. The device for reducing dynamic impedances according to claim 1, wherein the annular metal planes and their legs are obtained by etching a metal film fixed on the insulating film.

5. The device for reducing dynamic impedances according to claim 4, wherein the connection network is also obtained by etching.

6. The device for reducing dynamic impedances according to claim 5, wherein the leads of said connection network are connected to shortened leads of a lead frame.

7. The device for reducing dynamic impedances according to claim 1, wherein one of the annular metal planes is comprised of several portions.

8. The device for reducing dynamic impedances according to claim 7, wherein the one of annular metal planes comprises a capacitor connected between adjacent portions.

9. The device according to claim 1, wherein said insulating film is formed by a plastic tape.

10. An integrated circuit device comprising:
    an integrated circuit chip having a plurality of terminals to be connected to external circuits.
    a lead layer including a plurality of leads for coupling said terminals to said external circuits.
    a plurality of conductive layers formed on said lead layer, each of said conductive layers having first conductors coupled to the corresponding terminals and second conductors coupled to the corresponding external circuits, said first conductors being connected to said second conductors through the corresponding leads, and
    a plurality of insulating layers disposed between said conductive layers for their electrical insulation from each other.

11. The device of claim 10 further comprising a molded case enclosing said integrated circuit chip and said plurality of conductive and insulating layers.

12. The device of claim 10, wherein said first and second conductors comprise legs soldered to the corresponding leads.

13. The device of claim 10, wherein at least one of said conductive layers comprises a plurality of portions.

14. The device of claim 13 further comprising capacitance means coupled between said portions.

15. The device of claim 10, wherein said plurality of conductive layers comprises an upper conductive layer including a plurality of portions.

16. The device of claim 15 further comprising capacitance means coupled between at least two of said portions.

17. The device of claim 10, wherein said insulating layers are formed by plastic tapes.

18. The device of claim 10, wherein each of said conductive layer comprises an annular metal plane surrounding said integrated circuit chip.

* * * * *